United States Patent
Haiut (10) Patent No.: US 8,937,515 B2
(45) Date of Patent: Jan. 20, 2015

(54) DEVICE AND METHOD FOR DIRECT MIXING OF PULSE DENSITY MODULATION (PDM) SIGNALS

(71) Applicant: Moshe Haiut, Ramat Gan (IL)

(72) Inventor: Moshe Haiut, Ramat Gan (IL)

(73) Assignee: DSP Group Ltd., Herzeliya (IL)

( * ) Notice: Subject to any disclaimer, the term of this patent is extended or adjusted under 35 U.S.C. 154(b) by 0 days.

(21) Appl. No.: 14/060,626

(22) Filed: Oct. 23, 2013

(65) Prior Publication Data

US 2014/0132304 A1 May 15, 2014

Related U.S. Application Data

(60) Provisional application No. 61/726,692, filed on Nov. 15, 2012.

(51) Int. Cl.
*H03K 7/08* (2006.01)
*H03M 1/00* (2006.01)

(52) U.S. Cl.
CPC ........................................ *H03M 1/00* (2013.01)
USPC ............... 332/117; 332/109; 381/98; 326/52; 327/155

(58) Field of Classification Search
USPC ........ 326/52; 327/155; 381/98; 332/109, 117
See application file for complete search history.

(56) References Cited

U.S. PATENT DOCUMENTS

| | | | |
|---|---|---|---|
| 8,170,147 B2 * | 5/2012 | Lee et al. | 375/319 |
| 8,373,357 B2 * | 2/2013 | Lundstrum et al. | 315/291 |
| 2004/0246060 A1 * | 12/2004 | Varis et al. | 332/109 |
| 2012/0195441 A1 * | 8/2012 | Moon et al. | 381/98 |

* cited by examiner

*Primary Examiner* — Don Le
(74) *Attorney, Agent, or Firm* — Oren Reches (57) ABSTRACT

A device for mixing multiple (N) pulse density modulated (PDM) bit streams of a bit rate, the device comprises an input logic, an error accumulation circuit, an error correction circuit and an adder of more than N bits; wherein the device is arranged to output an output PDM bit stream that represents a mixture of the multiple input PDM bit streams; wherein the output PDM bit stream comprises a plurality of output PDM bits, wherein a certain output PDM bit of a plurality of output PDM bits that form the output PDM bit stream is generated during a certain clock cycle; wherein the input logic is arranged to select, during each fraction of the certain clock cycle, a current bit of a selected PDM bit stream, wherein different PDM bit streams are selected during different fragments of the certain clock cycle; wherein the error accumulation circuit is arranged to store intermediate values during a first fraction till a penultimate fraction of the certain clock signal and to store a last value during a last fraction of the certain clock signal.

22 Claims, 9 Drawing Sheets

DEVICE AND METHOD FOR DIRECT MIXING OF PULSE DENSITY MODULATION (PDM) SIGNALS

RELATED APPLICATIONS

This patent claims priority from U.S. patent application Ser. No. 61/726,692 filing date Nov. 15, 2012 which is incorporated herein in its entirety by reference.

BACKGROUND OF THE INVENTION

Pulse Density Modulation (PDM) is used to convert analog signals to binary data and vice versa, where bit rate or clock frequency are not limited. PDM is used in Sigma-Delta circuits to produce analog audio outputs (e.g. in a DAC embodiment) or to convert analog inputs to digital samples (e.g. in a ADC embodiment). Miniature digital MEMS microphones also use PDM as their digital output stage.

PDM uses a train of identical pulses of a single clock duration and constant amplitude, whose density describes the amplitude of a given analog signal. The pulse train can be regarded as a series of 1-bit samples at a sampling rate that is much higher than the Nyqvist sampling rate of the analog signal.

Most Digital Signal Processing (DSP) systems that use PDM input ports must convert the input data into multiple bit samples before making any processing. This conversion is usually done by dedicated hardware that includes complicated Sigma-Delta designs. For example, a beam-forming system that uses multiple digital PDM microphones would first convert all its PDM inputs into 16-bit samples, and then mix them together with individual delays and weighting factors. The weighting-factors will require a 16-bit multiply operation per every channel, and each delay may require a calculation of an interpolation filter (for sub-samples delays). This would consume a significant silicon area as well as significant amount of DSP MIPS.

SUMMARY OF THE INVENTION

According to various embodiments of the invention there may be provided devices, methods, and mixers as claimed in the claims and/or illustrated in the specification.

There may be provided, according to an embodiment of the invention, a device for mixing multiple (N) pulse density modulated (PDM) bit streams of a bit rate, the device may include an input logic, an error accumulation circuit, an error correction circuit and an adder of more than N bits; wherein the device may be arranged to output an output PDM bit stream that represents a mixture of the multiple input PDM bit streams; wherein the output PDM bit stream may include a plurality of output PDM bits, wherein a certain output PDM bit of a plurality of output PDM bits that form the output PDM bit stream is generated during a certain clock cycle; wherein the input logic may be arranged to select, during each fraction of the certain clock cycle, a current bit of a selected PDM bit stream, wherein different PDM bit streams are selected during different fragments of the certain clock cycle; wherein the error accumulation circuit may be arranged to store intermediate values during a first fraction till a penultimate fraction of the certain clock signal and to store a last value during a last fraction of the certain clock signal; wherein a sign of the last value is provided as the certain PDM output bit; wherein the adder may be arranged to add, during each fraction of the certain clock cycle, the current bit of the selected PDM bit stream to on an intermediate value that was calculated during a previous fraction; and wherein the error correction circuit may be arranged to apply an error correction on the last value to provide an updated value that is provided as an intermediate value during a first fraction of a clock cycle that follows the certain clock cycle.

The input logic may be arranged to generate, in response to a sign of the current bit of the selected PDM bit stream, a first control signal; and wherein the adder may be arranged to perform, during each fraction of the certain clock cycle, a selected arithmetic operation out of subtraction and addition, wherein the selected arithmetic operation is selected in response to the first control signal.

The adder may be arranged to apply the selected arithmetic operation on an absolute value of the current bit of the selected PDM bit stream and on an intermediate value that was calculated during a previous fraction.

The device may include a coefficient multiplexer that may be arranged to select a selected coefficient associated with the selected PDM bit stream; wherein the adder may be arranged to perform the selected arithmetic operation on the selected coefficient and on an intermediate value that was calculated during a previous fraction.

The error correction circuit may be arranged to generate an updated value by adding to the last value an error correction constant if the last value is negative and by subtracting from the last value the error correction constant if the last value is positive.

The device may include a digital delay circuit that may be arranged to introduce adjustable delay periods to current bits of the multiple input PDM bit streams to provide delayed current bits to the input circuit.

The input logic, the error accumulation circuit, the error correction circuit and the adder may be embedded in a handset and wherein the multiple input PDM bit streams are provided from multiple microphones.

The input logic, the error accumulation circuit, the error correction circuit and the adder may be embedded in an interfacing circuit and wherein the multiple input PDM bit streams are provided from multiple microphones.

There may be provided, according to an embodiment of the invention, a mixer for mixing first and second modified pulse density modulated (PDM) bit streams to provide an output modified PDM bit stream; wherein the mixer consists essentially of a first exclusive OR (XOR) gate, a second XOR gate, a first AND gate, a second AND gate, a OR gate and a flip-flop; wherein a minus one value of a PDM bit is mapped to a one value of a modified PDM bit and a plus one value of a PDM bit is mapped to a zero value of a modified PDM bit; wherein a first input of the first XOR gate and a first input of the first AND gate may be arranged to receive the first modified PDM bit stream; wherein a second input of the first XOR gate and a second input of the first AND gate may be arranged to receive the second modified PDM bit stream; wherein an output of the first XOR gate is coupled to a first input of the second XOR gate and to a non-inverting input of the second AND gate; wherein an output of the second XOR gate is coupled to an input port of the flip-flop; wherein an output of the first AND gate is coupled to a first input of the OR gate; wherein an output port of the flip-flop is coupled to a second input of the second XOR gate; wherein an output port of the flip-flop is coupled to an inverting input of the second AND gate and to a second input of the second XOR gate; wherein an output of the second AND gate is coupled to a second input of the OR gate; and wherein an output of the OR gate forms an output port of the mixer for providing the output modified PDM bit stream.

The first XOR gate and the first AND gate may be arranged to receive during a certain clock cycle a certain modified bit of the first PDM bit stream and a certain modified bit of the second PDM bit stream; wherein the first XOR gate may be arranged to apply a XOR operation on the certain bits of the first and second PDM bit streams to provide a first XOR output bit; wherein the first AND gate may be arranged to apply an AND operation on the certain modified bits of the first and second PDM bit streams to provide a first AND output bit; wherein the second XOR gate may be arranged to generate a second XOR output bit by applying a XOR operation on the first XOR output bit and on an output bit of the flip-flop, the output bit of the flip-flop represents a second XOR output bit provided to the flip-flop during a previous clock cycle; wherein the second AND gate may be arranged to apply an AND operation an inverted output bit of the flip flop and on the first AND output bit; and wherein the OR gate may be arranged to apply an OR operation on the first and second AND output bits to provide a certain modified output PDM bit.

There may be provided, according to an embodiment of the invention, a device for mixing multiple (N) pulse density modulated (PDM) bit streams, the device may include: an input modifier arranged to modify the multiple input PDM bit streams to provide multiple modified PDM bit streams by mapping a minus one value of each PDM bit to a one value of a modified PDM bit and by mapping a plus one PDM bit to a minus one value modified PDM bit; an array of mixers that are coupled to each other, the array of mixers may be arranged to receive the multiple modified PDM bit streams and to output a modified output PDM bit stream that represents a mixture of the multiple modified PDM bit streams; wherein each mixer of the array of mixers consists essentially of a first exclusive OR (XOR) gate, a second XOR gate, a first AND gate, a second AND gate, a OR gate and a flip-flop; wherein a first input of the first XOR gate and a first input of the first AND gate form a first input port of the mixer; wherein a second input of the first XOR gate and a second input of the first AND gate form a second input port of the mixer; wherein an output of the first XOR gate is coupled to a first input of the second XOR gate and to a non-inverting input of the second AND gate; wherein an output of the second XOR gate is coupled to an input port of the flip-flop; wherein an output of the first AND gate is coupled to a first input of the OR gate; wherein an output port of the flip-flop is coupled to a second input of the second XOR gate; wherein an output port of the flip-flop is coupled to an inverting input of the second AND gate and to a second input of the second XOR gate; wherein an output of the second AND gate is coupled to a second input of the OR gate; and wherein an output of the OR gate forms an output port of the mixer.

The device may include an output modifier arranged to modify the modified output PDM bit stream to provide an output PDM bit stream by mapping each modified output PDM bit of a zero value to an output PDM bit of a minus one value.

The array of mixers may include a binary tree of adders.

The device may include a multiplier for multiplying at least one of the output PDM bit stream and the modified output PDM bit stream by a coefficient.

There may be provided, according to an embodiment of the invention, a method for mixing multiple (N) pulse density modulated (PDM) bit streams of a bit rate, the method may include: receiving the multiple input PDM bit streams; and processing the multiple input PDM bit streams to generate an output PDM bit stream that represents a mixture of the multiple input PDM bit streams; wherein the output PDM bit stream may include a plurality of output PDM bits; wherein the processing may include generating a certain output PDM bit during a certain clock cycle; wherein the generating of the certain output PDM bit may include: selecting, by input logic, during each fraction of the certain clock cycle, a current bit of a selected PDM bit stream, wherein different PDM bit streams are selected during different fragments of the certain clock cycle; storing intermediate values during a first fraction till a penultimate fraction of the certain clock signal and to store a last value during a last fraction of the certain clock signal; wherein a sign of the last value is provided as the certain PDM output bit; adding, by an adder and during each fraction of the certain clock cycle, the current bit of the selected PDM bit stream to on an intermediate value that was calculated during a previous fraction; and applying, by an error correction circuit, an error correction on the last value to provide an updated value that is provided as an intermediate value during a first fraction of a clock cycle that follows the certain clock cycle.

The method may include generating, in response to a sign of the current bit of the selected PDM bit stream, a first control signal; and performing by the adder and during each fraction of the certain clock cycle, a selected arithmetic operation out of subtraction and addition, wherein the selected arithmetic operation is selected in response to the first control signal.

The method may include applying by the added the selected arithmetic operation on an absolute value of the current bit of the selected PDM bit stream and on an intermediate value that was calculated during a previous fraction.

The method may include selecting a selected coefficient associated with the selected PDM bit stream and performing the selected arithmetic operation on the selected coefficient and on an intermediate value that was calculated during a previous fraction.

The method may include generating an updated value by adding to the last value an error correction constant if the last value is negative and by subtracting from the last value the error correction constant if the last value is positive.

The method may include introducing adjustable delay periods to current bits of the multiple input PDM bit streams to provide delayed current bits to the input circuit.

The method may include receiving the multiple input PDM bit streams from multiple microphones.

There may be provided, according to an embodiment of the invention, a method for mixing first and second modified pulse density modulated (PDM) bit streams to provide an output modified PDM bit stream; the method may include receiving the first and second modified PDM bit streams by a mixer; and processing the first and second modified PDM bit streams by the mixer to provide a modified output PDM bit stream; wherein the mixer consists essentially of a first exclusive OR (XOR) gate, a second XOR gate, a first AND gate, a second AND gate, a OR gate and a flip-flop; wherein a minus one value of a PDM bit is mapped to a one value of a modified PDM bit and a plus one value of a PDM bit is mapped to a zero value of a modified PDM bit; wherein a first input of the first XOR gate and a first input of the first AND gate may be arranged to receive the first modified PDM bit stream; wherein a second input of the first XOR gate and a second input of the first AND gate may be arranged to receive the second modified PDM bit stream; wherein an output of the first XOR gate is coupled to a first input of the second XOR gate and to a non-inverting input of the second AND gate; wherein an output of the second XOR gate is coupled to an input port of the flip-flop; wherein an output of the first AND gate is coupled to a first input of the OR gate; wherein an output port of the flip-flop is coupled to a second input of the second XOR gate; wherein an output port of the flip-flop is coupled to an inverting input of the second AND gate and to a second input of the second XOR gate; wherein an output of the second AND gate is coupled to a second input of the OR gate; and wherein an output of the OR gate forms an output port of the mixer for providing the output modified PDM bit stream.

The method wherein the processing may include generating a certain bit of the modified PDM bit stream during a certain clock cycle; wherein the generating of the certain bit may include: receiving by the first XOR gate and the first AND gate a certain modified bit of the first PDM bit stream and a certain modified bit of the second PDM bit stream; applying by the first XOR gate, a XOR operation on the certain bits of the first and second PDM bit streams to provide a first XOR output bit; applying by the first AND gate an AND operation on the certain modified bits of the first and second PDM bit streams to provide a first AND output bit; generating by the second XOR gate a second XOR output bit by applying a XOR operation on the first XOR output bit and on an output bit of the flip-flop, the output bit of the flip-flop represents a second XOR output bit provided to the flip-flop during a previous clock cycle; applying by the second AND gate an AND operation an inverted output bit of the flip flop and on the first AND output bit; and applying by the OR gate an OR operation on the first and second AND output bits to provide the certain modified output PDM bit.

There may be provided, according to an embodiment of the invention, a method for mixing multiple (N) pulse density modulated (PDM) bit streams, the device may include: modifying, by an input modifier, the multiple input PDM bit streams to provide multiple modified PDM bit streams by mapping a minus one value of a PDM bit to a one value of a modified PDM bit and by mapping a plus one value of a PDM bit to a zero value of a modified PDM bit; providing the multiple modified PDM bit streams to an array of mixers that are coupled to each other; and processing, by the array of mixers, the multiple modified PDM bit streams to provide a modified output PDM bit stream that represents a mixture of the multiple modified PDM bit streams; wherein each mixer of the array of mixers consists essentially of a first exclusive OR (XOR) gate, a second XOR gate, a first AND gate, a second AND gate, a OR gate and a flip-flop; wherein a first input of the first XOR gate and a first input of the first AND gate form a first input port of the mixer; wherein a second input of the first XOR gate and a second input of the first AND gate form a second input port of the mixer; wherein an output of the first XOR gate is coupled to a first input of the second XOR gate and to a non-inverting input of the second AND gate; wherein an output of the second XOR gate is coupled to an input port of the flip-flop; wherein an output of the first AND gate is coupled to a first input of the OR gate; wherein an output port of the flip-flop is coupled to a second input of the second XOR gate; wherein an output port of the flip-flop is coupled to an inverting input of the second AND gate and to a second input of the second XOR gate; wherein an output of the second AND gate is coupled to a second input of the OR gate; and wherein an output of the OR gate forms an output port of the mixer.

The method may include modifying, by an output modifier the modified output PDM bit stream to provide an output PDM bit stream by mapping each modified output PDM bit of a zero value to an output PDM bit of a minus one value.

The method wherein the array of mixers may include a binary tree of adders.

The method multiplying at least one of the output PDM bit stream and the modified output PDM bit stream by a coefficient.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may, for the most part, be implemented using electronic components and modules known to those skilled in the art, details will not be explained in any greater extent than that considered necessary as illustrated above, for the understanding and appreciation of the underlying concepts of the present invention and in order not to obfuscate or distract from the teachings of the present invention.

There are provided simple implementations of a mix operation of multiple input PDM sources, resulting in a PDM output. It requires that all PDM sources be of the same bit rate with a common clock, and it is direct in the sense that does not require conversion to multiple-bit samples.

The device may require a single adder to implement the weighting factors for the mix operation, and simple 1-bit delay-lines for the various delays. For example, a beam-forming array of multiple digital PDM microphones can be implemented in a minimum amount of logic, using the concept of this patent.

PDM can be explained in reference to a sinus wave. In each clock cycle the PDM signal gets a binary value—in this example either +1 or −1. The density of the +1 pulses is proportional to the value of the analog sine signal and reaches its maximum value around the peak point of the sine wave. Similarly, the density of the −1 pulses reaches its maximum value around the minimum point of the sine wave.

Figure 1:
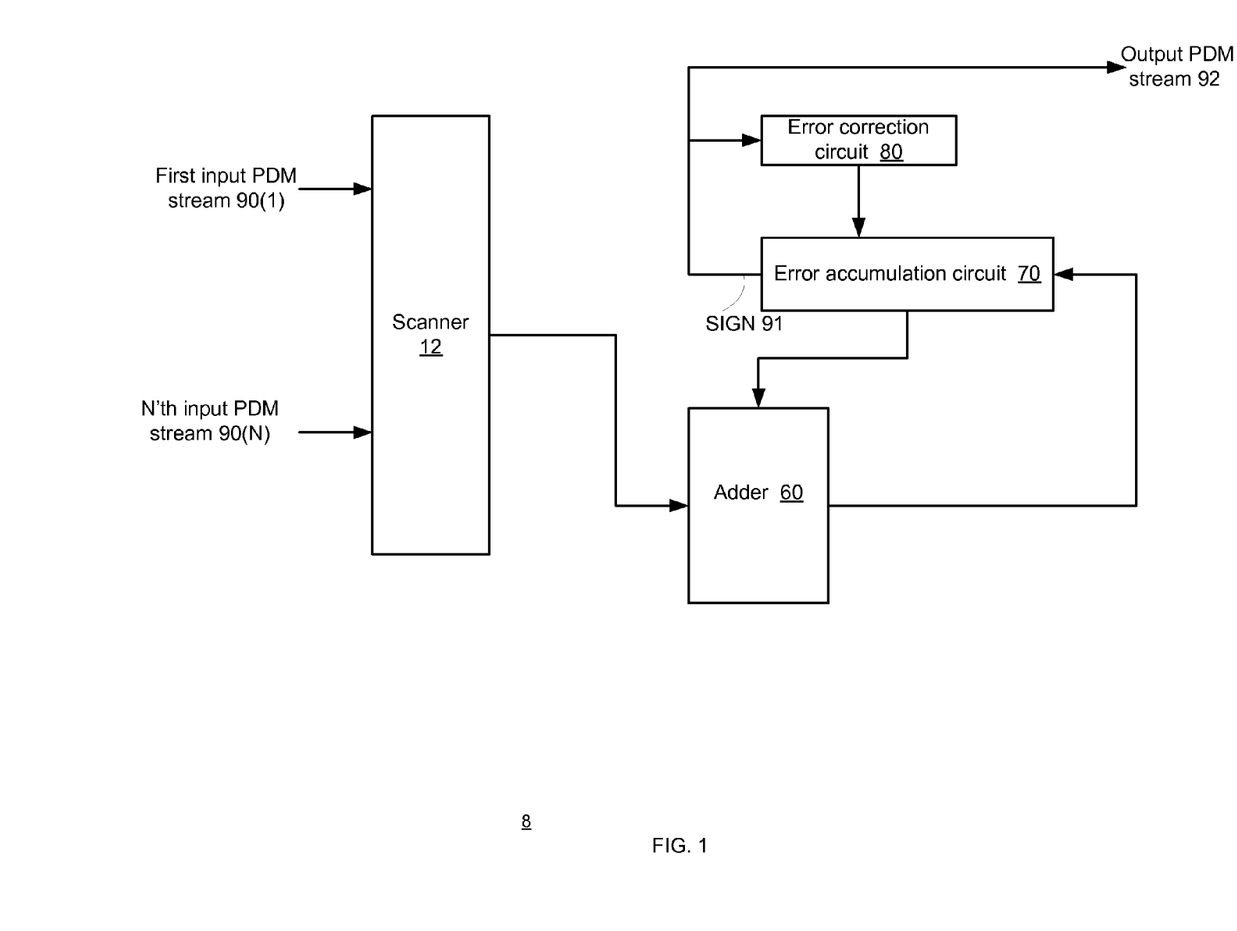
FIG. 1 illustrates a device according to an embodiment of the invention.

Mixing Multiple (N) Input PDM Bit Streams to Provide an Average of the Multiple Input PDM Bit Streams Assume N PDM sources that represent N independent analog signals, and assume a common clock for all the N PDM sources. FIG. 1 presents a device 8 according to an embodiment of the invention that produces a single PDM bit stream that represents a mixed signal of all the N analog inputs assuming that an average of these N PDM bit streams is required to be calculated by the mixer.

FIG. 1 illustrates device 8 for mixing multiple (N) pulse density modulated (PDM) bit streams of a bit rate, according to an embodiment of the invention.

Device 8 includes input logic 12, an error accumulation circuit (such as an error accumulation register) 70, an error correction circuit 80 and an adder 60 of more than N bits.

Device 8 is arranged to output an output PDM bit stream 92 that represents a mixture of the multiple input PDM bit streams 90(1)-90(N). The output PDM bit stream 92 that represents an analog signal that is an average of the multiple analog signals that are represented by input PDM bit streams 90(1)-90(N)—as all of these input PDM bit streams are assigned the same weight of 1/N.

The output PDM bit stream includes a plurality of output PDM bits and is generated one output PDB bit at a time during a clock cycle of a duration that corresponds to the bit rate of the multiple input PDM bit streams 90(1)-90(N).

The following explanation will describe the operations executed by device 8 during a certain clock cycle for generating a certain output PDM bit of a plurality of output PDM bits that form the output PDM bit stream is generated during a certain clock cycle.

During each lock cycle the device 8 has to process a bit from each one of the PDM bit streams—thus there should be at least N fractions. The device can select the PDM bit streams according to any arrangement—according to a predetermined pattern, randomly and the like.

The bit that is selected from a selected PDM bit stream is referred to as a current bit.

Figure 3:
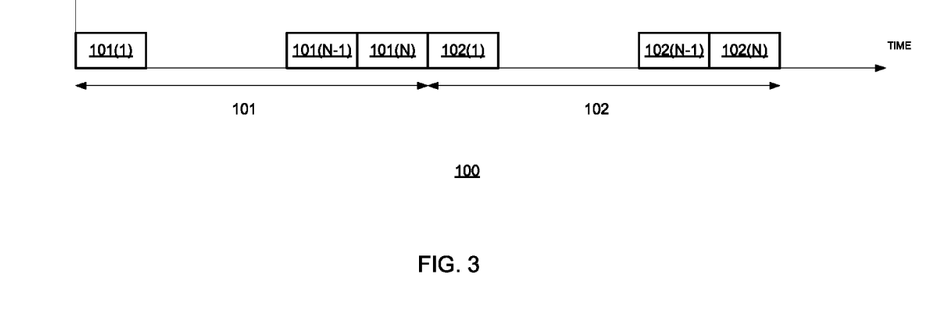
FIG. 3 is a timing diagram according to an embodiment of the invention.

The clock cycle is divided to fractions (see fractions 101(1)-101(N)) of clock cycle 101 and fractions 102(1)-102(N) of clock cycle 102 of FIG. 3).

Input logic 12 is arranged to select, during each fraction of the certain clock cycle, a current bit of a selected PDM bit stream. As indicated above the different PDM bit streams are selected during different fragments of the certain clock cycle.

The input logic 12 can include a multiplexer and a scanner for scanning the inputs of the multiplexer—each input is fed by a different PDM bit stream.

The content of the error accumulation circuit 70 is updated N times during each clock cycle—once per each fragment. It is arranged to store intermediate values during a first fraction till a penultimate fraction of the certain clock signal (101(1)-101(N−1)) and to store a last value during a last fraction (101(N)) of the certain clock signal.

The sign of the last value is provided as the certain PDM output bit.

The adder 60 is arranged to add, during each fraction of the certain clock cycle, the current bit (values of +1 or −1) of the selected PDM bit stream to on an intermediate value that was calculated during a previous fraction. Thus, during fraction 101(2) the intermediate value of the error accumulation circuit at 101(1) will be added to the current bit.

The error correction circuit 80 is arranged to apply an error correction on the last value to provide an updated value that is provided as an intermediate value during a first fraction of a clock cycle that follows the certain clock cycle. The error correction can include an addition or subtraction of $2^{J-1}$. If the certain PDM output bit is positive (SIGN 91 is indicative of a positive value) then $2^{J-1}$ is subtracted from the last value to provide an updated value. This can be attributed to the fact that a device that receives the +1 valued PDM output bit maps this bit to a half highest positive value of the dynamic range of the device 8 which is $2^{J-1}$. If the certain PDM output bit is negative (SIGN 91 is indicative of a negative value) then $2^{J-1}$ is added to from the last value to provide an updated value. The updated value is provided to the adder 60 during the first fraction (102(1)) of the next clock cycle.

Mixing Multiple (N) Input PDM Bit Streams Using Delays and/or Coefficients

Figure 2:
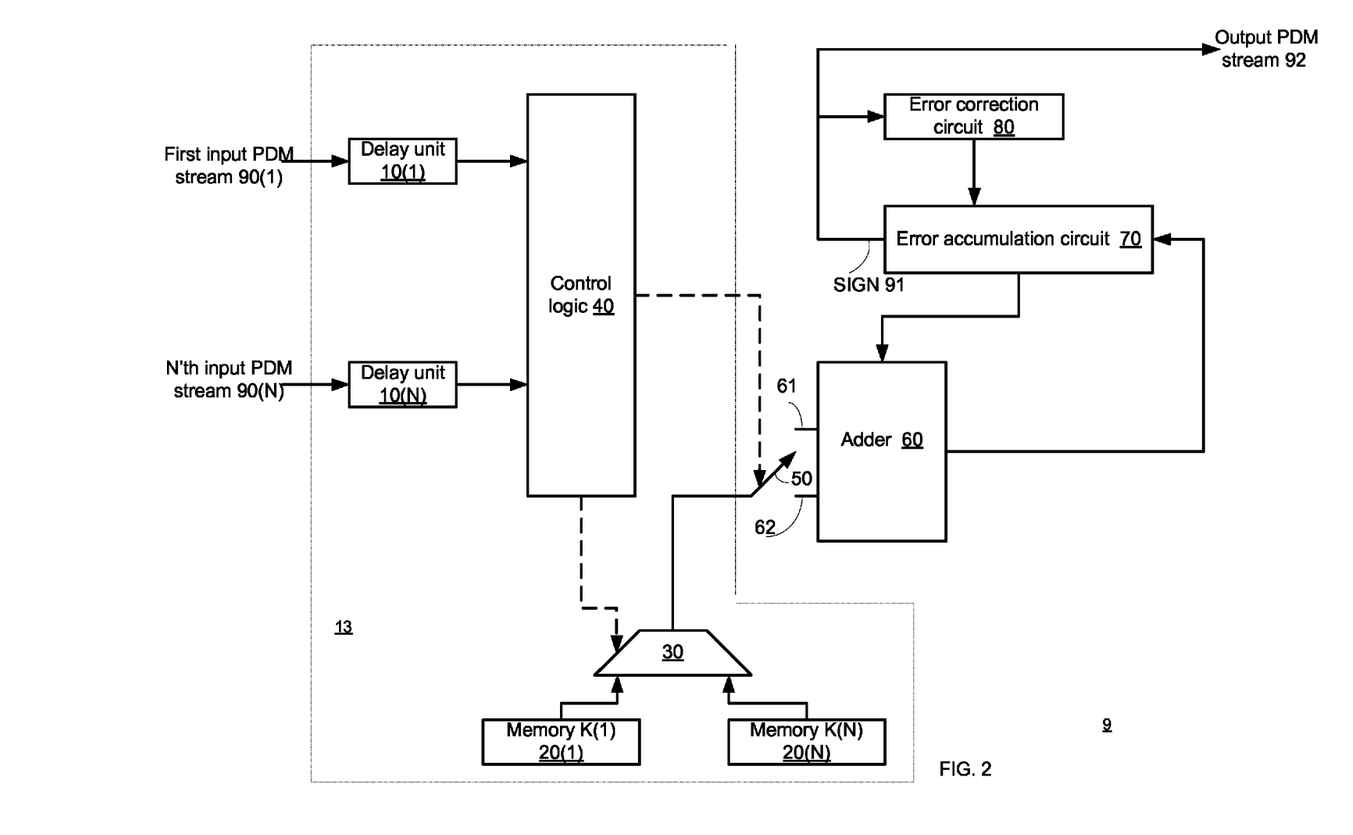
FIG. 2 illustrates a device according to an embodiment of the invention.

A device 9 that can perform additional operations such as introducing delays and multiplying PDM bit streams by different coefficients according to an embodiment of the invention is illustrated in FIG. 2.

Each input PDM bit stream can be delayed by a given constant number of clock cycles and weighted via a given coefficient to construct the output signal.

The device 9 of FIG. 2 uses N constant values K(1)-K(N) (of J-bits plus sign bit each) that represent the N weighting coefficients values C(1)-C(N) to produce the mixed output signal. They are calculated in the manner illustrated below.

In the following text index n ranges between 1 and N.

Assume a weighting coefficient C(n) where −1.0≤C(n)≤+1.0 then K(n)=C(n)*$2^{J-1}$ This way each one of the values K(n) is not expected to exceed half the dynamic range of $(-2^J, +2^J)$. It is also assumed that the sum of all values K(n) does not exceed half the dynamic range of $(-2^J, +2^J)$, otherwise overflow may occur and the output signal may be corrupted. This can be achieved by putting the following constraint on the original weighting coefficients: −1.0≤ΣC(n)≤+1.0

The input delay lines may be implemented using single-bit shift registers of the appropriate length D(n) per each input source. This produces a delay of D(n) clock cycles, which enable sub-sample delays of high granularity in terms of Nyquist sampling rate of the input analog signals.

The device 9 includes an error accumulation circuit (such as an error accumulation register) that is updated after each clock cycle with a 2's-compliment signed value of the output error with a dynamic range of $(-2^J, +2^J)$. The output error is a digital signal whose energy is located mainly in the higher frequencies as close as possible to half the frequency of the PDM clock. The error signal exists due to the fact that the PDM output can only accept binary values.

In each clock cycle the control logic scans all the N PDM inputs. For each input n the constant number K(n) is either added to (if PDMn=+1) or subtracted from (if PDMn=−1) the Error Accumulation register, using an adder of J bits with an additional sign bit. After scanning all the signal inputs, the sign bit of the Error Accumulation register is used as the PDM out value (a positive value of the register produces output +1 and a negative value produces output −1). Before the beginning of the next PDM clock cycle the two most significant bits of the Error Accumulation register (this includes the sign bit which is the MSbit) are modified to subtract the value $2^{J-1}$ if the output value was set to +1 or add the value $2^{J-1}$ if the output value was set to −1.

Assume two PDM inputs from two digital MEMS microphones that are driven by a clock of 2.4 MHz.

The following explanation will describe the operations executed by device 9 during a certain clock cycle for generating a certain output PDM bit of a plurality of output PDM bits that form the output PDM bit stream is generated during a certain clock cycle.

During each clock cycle the device 9 has to process a bit from each one of the PDM bit streams—thus there should be at least N fractions. The device can select the PDM bit streams according to any arrangement—according to a predetermined pattern, randomly and the like.

The bit that is selected from a selected PDM bit stream is referred to as a current bit.

The clock cycle is divided to fractions (see fractions 101(1)-101(N)) of clock cycle 101 and fractions 102(1)-102(N) of clock cycle 102 of FIG. 3).

Device 9 includes an input logic 13, an error accumulation circuit (such as an error accumulation register) 70, an error correction circuit 70 and an adder 60 of more than N bits. The input logic 13 includes a control logic 40, delay units 10(1)-10(N), multiplexer 30 and memory units K(1)-K(N) 20(1)-20(N) for storing coefficients K(1)-K(N).

Device 9 differs from device 8 by being capable of delaying (by delay units 10(1)-10(N)) input PDM bit streams and by being capable of adding to a previously calculated intermediate value to a selected coefficient associated with each of the multiple input PDM bit streams instead just adding +1 or −1. The selected coefficient is selected using multiplexer 30 and memory units K(1)-K(N) 20(1)-20(N).

The addition of coefficients may require using an adder 60 that may either add or subtract a selected coefficient—in response to a first control signal provided by the control logic 40 which in turn is responsive to the sign of the current bit of the selected PDM bit stream. This can be implemented by using an adder 60 with a positive input 61 and a negative input 62 and feeding one of these inputs (by switch 50) with the coefficient.

The delay units 10(1)-10(N) form a digital delay circuit that is arranged to introduce adjustable delay periods to current bits of the multiple input PDM bit streams to provide delayed current bits to the input circuit. The delay units may be shift registers. In beam shaping application using relatively small shift registers can provide very good spatial resolution.

Figure 4A:
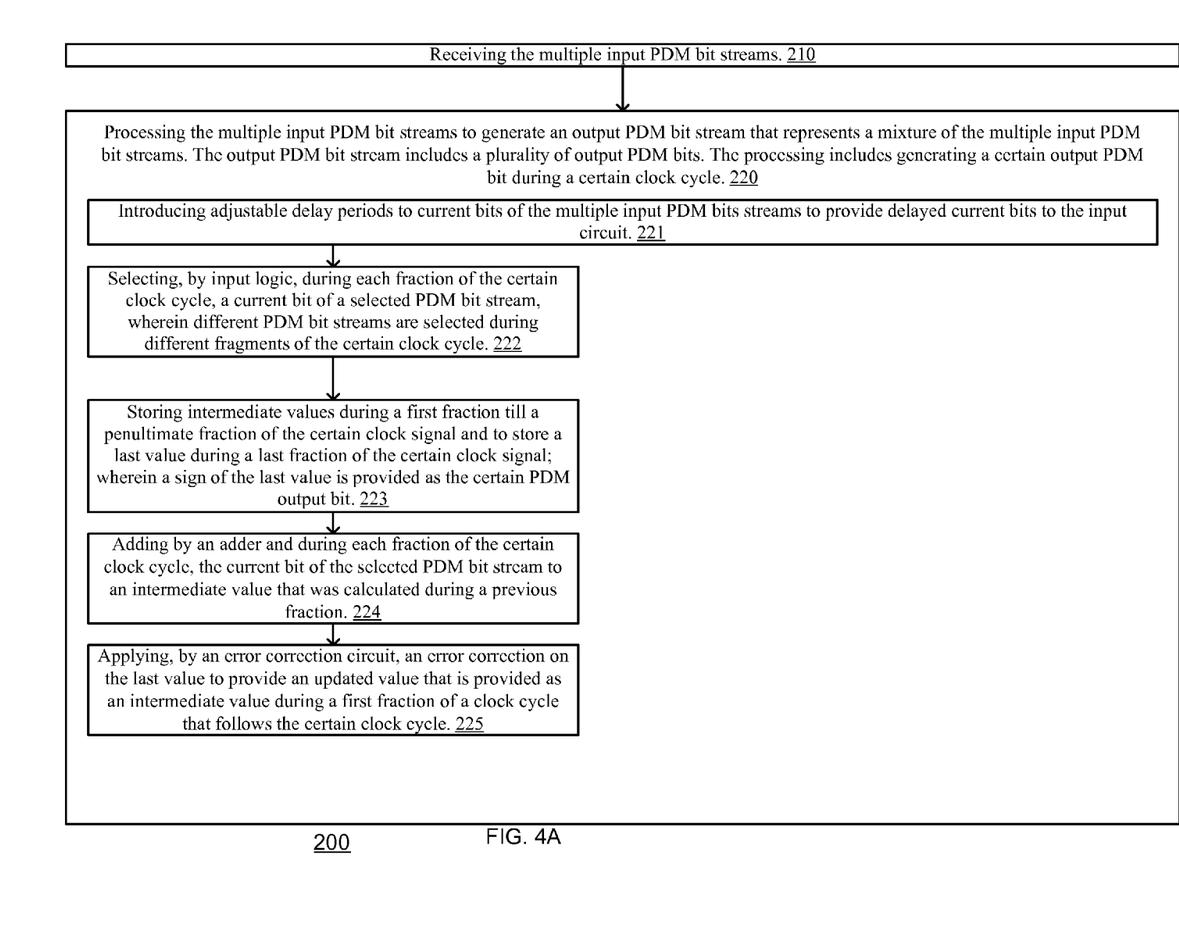
FIGS. 4A and 4B illustrate a method according to an embodiment of the invention.
Figure 4B:
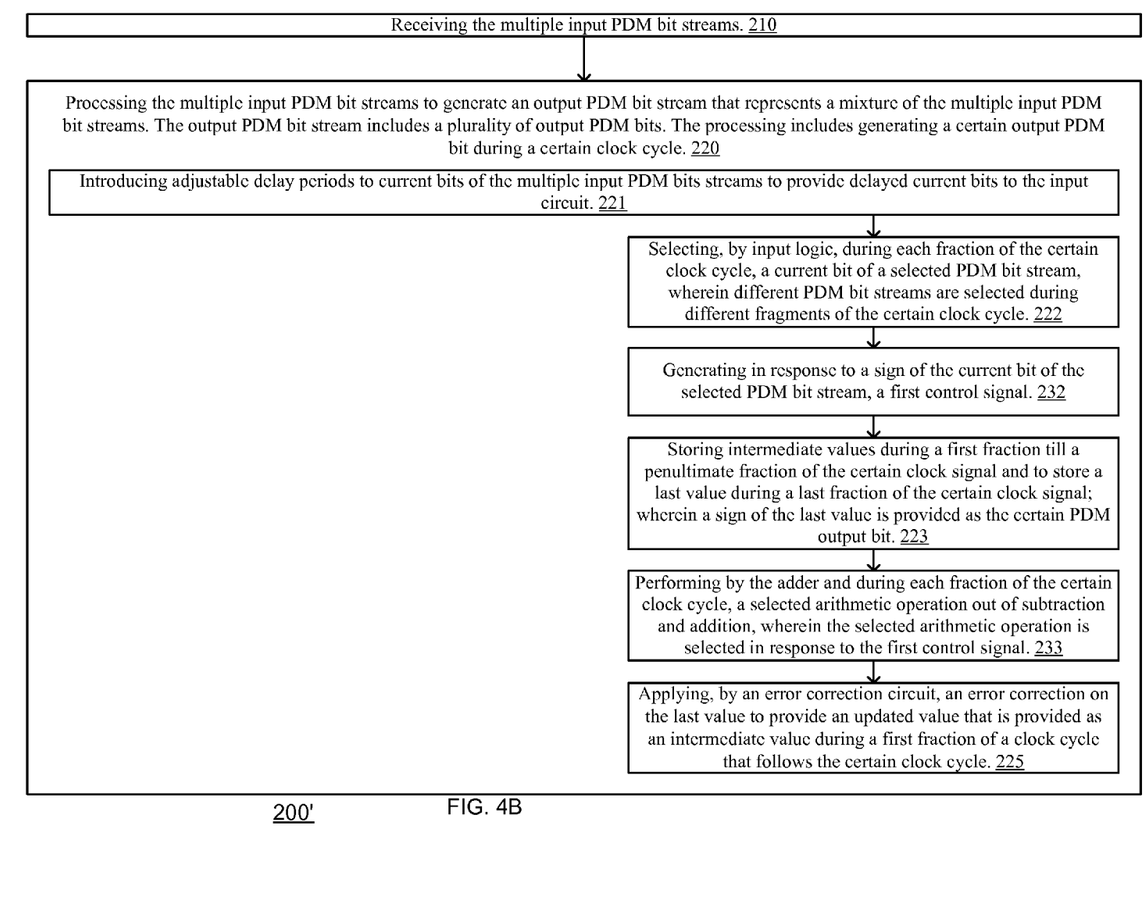

FIGS. 4A and 4B illustrate methods 200 and 200' according to an embodiment of the invention.

Method 200 is for mixing multiple (N) pulse density modulated (PDM) bit streams of a bit rate.

Method 200 starts by stage 210 of receiving the multiple input PDM bit streams.

Stage 210 is followed by stage 220 of processing the multiple input PDM bit streams to generate an output PDM bit stream that represents a mixture of the multiple input PDM bit streams. The output PDM bit stream includes a plurality of output PDM bits. The processing includes generating a certain output PDM bit during a certain clock cycle.

FIG. 4A illustrates that the generating of the certain output PDM bit may include:
  a. Selecting (222), by input logic, during each fraction of the certain clock cycle, a current bit of a selected PDM bit stream, wherein different PDM bit streams are selected during different fragments of the certain clock cycle.
  b. Storing (223) intermediate values during a first fraction till a penultimate fraction of the certain clock signal and to store a last value during a last fraction of the certain clock signal; wherein a sign of the last value is provided as the certain PDM output bit.
  c. Adding (224), by an adder and during each fraction of the certain clock cycle, the current bit of the selected PDM bit stream to on an intermediate value that was calculated during a previous fraction.
  d. Applying (225), by an error correction circuit, an error correction on the last value to provide an updated value that is provided as an intermediate value during a first fraction of a clock cycle that follows the certain clock cycle.

FIG. 4B illustrates that the generating of the certain output PDM bit may include:
  a. Selecting (222), by input logic, during each fraction of the certain clock cycle, a current bit of a selected PDM bit stream, wherein different PDM bit streams are selected during different fragments of the certain clock cycle.
  b. Generating (232), in response to a sign of the current bit of the selected PDM bit stream, a first control signal
  c. Storing (223) intermediate values during a first fraction till a penultimate fraction of the certain clock signal and to store a last value during a last fraction of the certain clock signal; wherein a sign of the last value is provided as the certain PDM output bit.
  d. Performing (233) by the adder and during each fraction of the certain clock cycle, a selected arithmetic operation out of subtraction and addition, wherein the selected arithmetic operation is selected in response to the first control signal.
  e. Applying (225), by an error correction circuit, an error correction on the last value to provide an updated value that is provided as an intermediate value during a first fraction of a clock cycle that follows the certain clock cycle.

Stage 224 may include generating an updated value by adding to the last value an error correction constant if the last value is negative and by subtracting from the last value the error correction constant if the last value is positive.

Stage 220 may include stage 221 of introducing adjustable delay periods to current bits of the multiple input PDM bit streams to provide delayed current bits to the input circuit. Stage 221 may be followed by stage 222.

Size-Limited Mixer for Averaging

If for example, the mixing output (Sout) equals an average of a first and second analog streams that a simple mixer can be used for processing two input PDM bit streams to provide an output PDM bit stream that can be then converted to an analog signal that is an average of the first and second analog signals.

The output analog signal S_out may equals $0.5*S_1 + 0.5*S_2$, where $S_1$ and $S_2$ represent the input analog signals and S_out represents the output analog signal.

This can be obtained by using a size limited mixer. It can be an implementation of device 8 using an adder of 1 bit.

Furthermore—in order to reduce the size of the mixer each PDM bit is modified—values +1 and −1 are mapped to values 0 and 1 respectively.

For this configuration we select N=1, which means that the error accumulation circuit 70 and the adder are 2-bit including the sign bit. The input logic 12 and error correction circuit can be implemented by a combinatorial logic or by a look-up table that makes all the summation calculations in a single clock (this also includes the $\pm 2^{J-1}$ operation).

The Combinatorial logic is an implementation of the following look-up-tables—one representing PDM bits and one modified PDM bits in which the −1 values are mapped to 1:

TABLE 1

| | | Previous value of logic | | | |
|---|---|---|---|---|---|
| $PDM_1$ | $PDM_2$ | 00 | 01 | 10 | 11 |
| +1 | +1 | 00, +1 | 01, +1 | 00, −1 | 11, +1 |
| +1 | −1 | 11, +1 | 00, +1 | 11, −1 | 00, −1 |
| −1 | +1 | 11, +1 | 00, +1 | 11, −1 | 00, −1 |
| −1 | −1 | 00, −1 | 11, +1 | 00, +1 | 11, −1 |

For modified PDM bits:

TABLE 2

| Modified | Modified | Previous value of logic | | | |
|---|---|---|---|---|---|
| PDM1 | PDM2 | 00 | 01 | 10 | 11 |
| 0 | 0 | 00, 0 | 01, 0 | 00, 1 | 11, 0 |
| 0 | 1 | 11, 0 | 00, 0 | 11, 1 | 00, 1 |
| 1 | 0 | 11, 0 | 00, 0 | 11, 1 | 00, 1 |
| 1 | 1 | 00, 1 | 11, 0 | 00, 0 | 11, 1 |

In these tables the values in the header line represent the current state of the error accumulator circuit register. The output of the look-up-table includes the next value of the error accumulator circuit, and the PDM output value.

One can easily realize that—if the initial state is '00'—the output of the look-up-table for the error accumulator circuit only includes the states '00' and '11'. This means that this logic can be further optimized by replacing the 2-bit register with a 1-bit register.

If the Boolean values +1 and −1 for the PDM signals are implemented by logical values '0' and '1' respectively, the whole circuit can be reduced to the logic circuit shown in FIG. 5 below.

Figure 5:
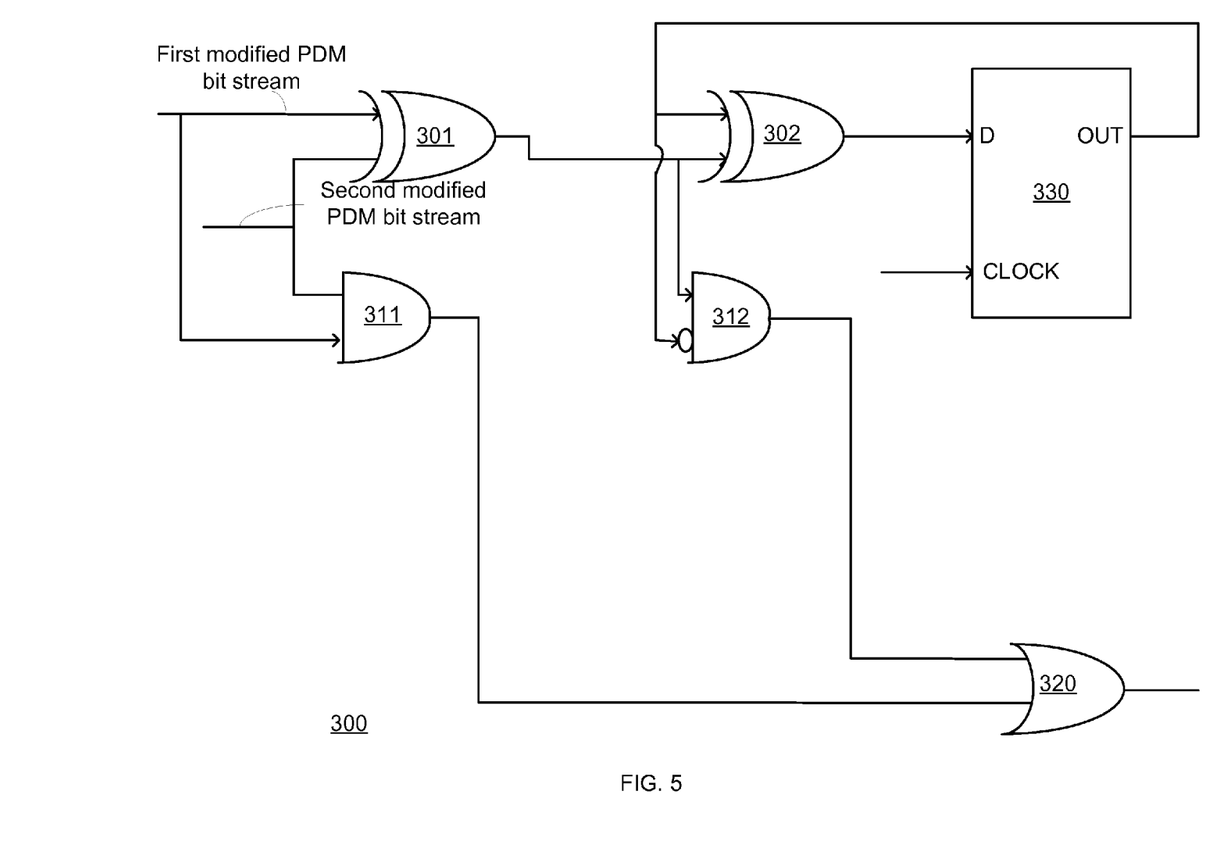
FIG. 5 illustrates a mixer according to an embodiment of the invention.

FIG. 5 illustrates mixer 300 for mixing first and second modified pulse density modulated (PDM) bit streams to provide an output modified PDM bit stream.

The mixer 300 consists essentially of a first exclusive OR (XOR) gate 301, a second XOR gate 302, a first AND gate 311, a second AND gate 312, an OR gate 320 and a flip-flop 330.

A minus one value of a PDM bit (of either one of the first and second PDM bit streams) is mapped to a '1' value of a modified PDM bit (of either one of the first and second PDM bit streams), while a plus one value is mapped to a '0' value.

A first input of the first XOR gate 301 and a first input of the first AND gate 311 are arranged to receive the first modified PDM bit stream. A second input of the first XOR gate 301 and a second input of the first AND gate 311 are arranged to receive the second modified PDM bit stream. An output of the first XOR gate 301 is coupled to a first input of the second XOR gate 302 and to a non-inverting input of the second AND gate 312. An output of the second XOR gate 302 is coupled to an input port of the flip-flop 330. An output of the first AND gate 311 is coupled to a first input of the OR gate 320. An output port of the flip-flop 330 is coupled to a second input of the second XOR gate 302. An output port of the flip-flop (D-type flip flop) 330 is coupled to an inverting input of the second AND gate 312 and to a second input of the second XOR gate 302.

An output of the second AND gate 312 is coupled to a second input of the OR gate 320. An output of the OR gate 320 forms an output port of the mixer 300 for providing the output modified PDM bit stream.

The operation of the mixer can be explained by the following example, referring to a generation of a single output PDM bit during a certain clock cycle.

The first XOR gate 301 and the first AND gate 311 are arranged to receive during a certain clock cycle a certain modified bit of the first PDM bit stream and a certain modified bit of the second PDM bit stream.

The first XOR gate 301 is arranged to apply a XOR operation on the certain bits of the first and second PDM bit streams to provide a first XOR output bit.

The first AND gate 311 is arranged to apply an AND operation on the certain modified bits of the first and second PDM bit streams to provide a first AND output bit.

The second XOR gate 302 is arranged to generate a second XOR output bit by applying a XOR operation on the first XOR output bit and on an output bit of the flip-flop 330. The output bit of the flip-flop represents a second XOR output bit provided to the flip-flop 330 during a previous clock cycle.

The second AND gate 312 is arranged to apply an AND operation an inverted output bit of the flip flop and on the first AND output bit.

The OR gate 320 is arranged to apply an OR operation on the first and second AND output bits to provide a certain modified output PDM bit.

Figure 6:
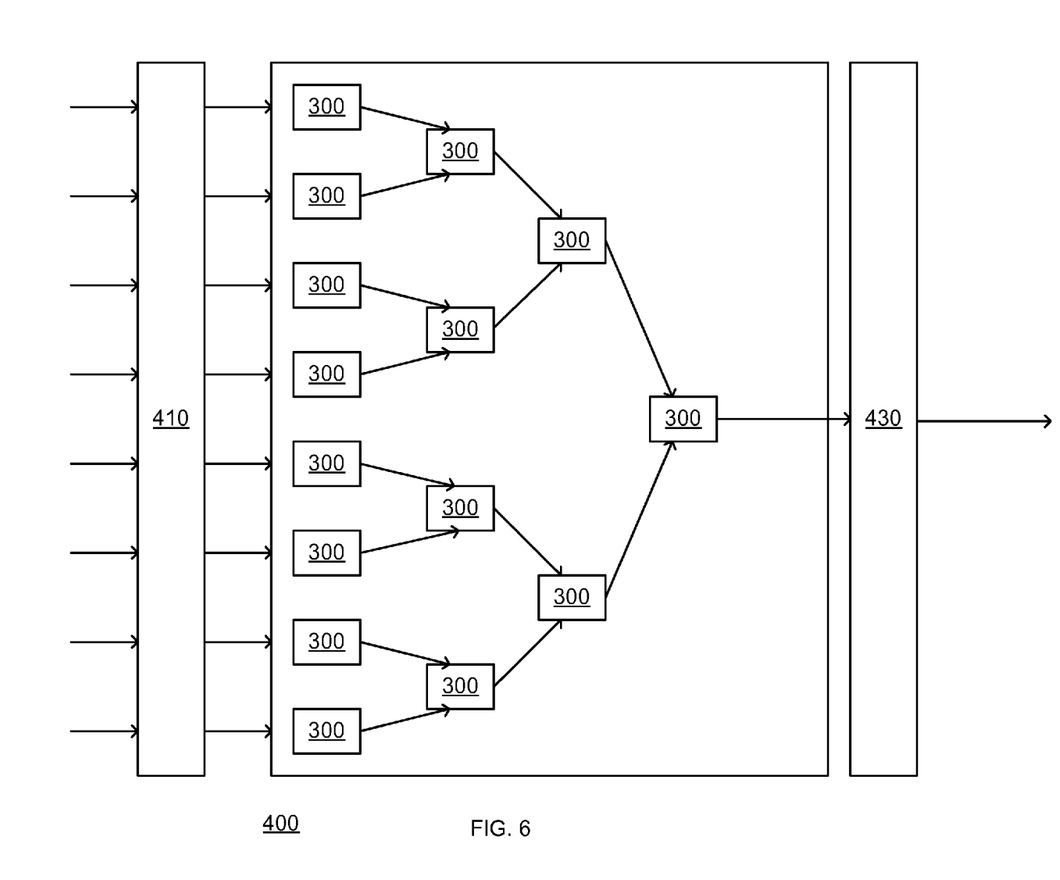
FIG. 6 illustrates a device according to an embodiment of the invention.

FIG. 6 illustrates a device 400 for mixing multiple (N) modified pulse density modulated (PDM) bit streams to provide an output modified PDM bit stream. N being a positive integer that exceeds 1.

Device 400 includes:
 a. An input modifier 410 arranged to modify the multiple input PDM bit streams to provide multiple modified PDM bit streams by mapping each PDM bit of a minus one value to a modified PDM bit of one value, and each PDM bit of a plus one value to a modified PDM bit of zero value.
 b. An array 420 of mixers (each mixers denoted 300 and may equal the mixer of FIG. 5) that are connected to each other, the array of mixers 300 are arranged to receive the multiple modified PDM bit streams and to output a modified output PDM bit stream that represents a mixture of the multiple modified PDM bit streams.
 c. An output modifier 430 arranged to modify the modified output PDM bit stream to provide an output PDM bit stream by mapping each modified output PDM bit of a zero value to an output PDM sample of a plus one value, and each modified output PDM bit of a one value to an output PDM bit of a minus one value.

The array 420 of mixers may include a binary tree of mixers. Assuming that N equals a power of two then for mixing N modified PDM bit streams the first stage of the tree may include N/2 mixers. The j'th stage of the binary tree may include N/2*k mixers. If N differs from a power of two but have value that is between $2^{T+1}$ and $2^T$ then the k'th stage of the binary tree may include $2^{T-1}/k$ mixers.

According to an embodiment of the invention the device can allow a multiplication by a single constant by using a multiplier.

Thus, by cascading N−1 mixers such as 300 the device can mix together N input lines of PDM signals into a single PDM output. This will require N−1 flip-flops and less than 10*N gates.

The device mentioned above can be arranged to perform a method for direct mixing of pulse density modulated (PDM) signals.

Figure 7:
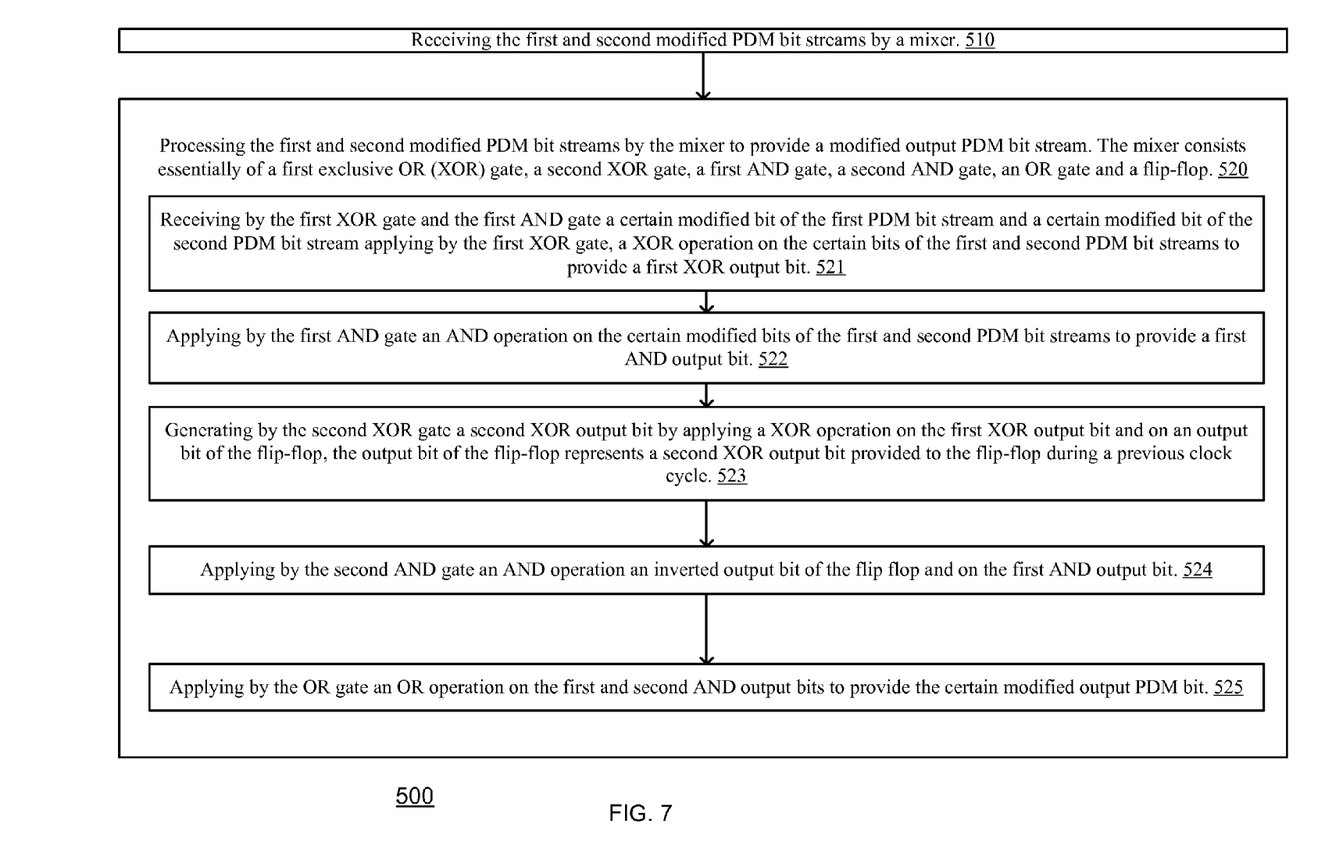
FIG. 7 illustrates a method according to an embodiment of the invention.

FIG. 7 illustrates a method 500 for mixing first and second modified pulse density modulated (PDM) bit streams to provide an output modified PDM bit stream.

Method 500 starts by stage 510 of receiving the first and second modified PDM bit streams by a mixer. The mixer can be mixer 300 of FIG. 4.

Stage 510 is followed by stage 520 of processing the first and second modified PDM bit streams by the mixer to provide a modified output PDM bit stream.

The mixer consists essentially of a first exclusive OR (XOR) gate, a second XOR gate, a first AND gate, a second AND gate, a OR gate and a flip-flop; wherein a minus one value of a bit of either one of the first and second PDM bit streams is mapped to a one value of a modified bit of either one of the first and second PDM bit streams, and a plus one is mapped to zero value; wherein a first input of the first XOR gate and a first input of the first AND gate are arranged to receive the first modified PDM bit stream; wherein a second input of the first XOR gate and a second input of the first AND gate are arranged to receive the second modified PDM bit stream; wherein an output of the first XOR gate is coupled to a first input of the second XOR gate and to a non-inverting input of the second AND gate; wherein an output of the second XOR gate is coupled to an input port of the flip-flop; wherein an output of the first AND gate is coupled to a first input of the OR gate; wherein an output port of the flip-flop is coupled to a second input of the second XOR gate; wherein an output port of the flip-flop is coupled to an inverting input of the second AND gate and to a second input of the second XOR gate; wherein an output of the second AND gate is coupled to a second input of the OR gate; and wherein an output of the OR gate forms an output port of the mixer for providing the output modified PDM bit stream.

The processing of stage 520 may include generating one output PDM bit stream after the other. It may include generating a certain bit of the modified PDM bit stream during a certain clock cycle. The generating of the certain bit may include:

a. Receiving (521) by the first XOR gate and the first AND gate a certain modified bit of the first PDM bit stream and a certain modified bit of the second PDM bit stream applying by the first XOR gate, a XOR operation on the certain bits of the first and second PDM bit streams to provide a first XOR output bit.

b. Applying (522) by the first AND gate an AND operation on the certain modified bits of the first and second PDM bit streams to provide a first AND output bit.

c. Generating (523) by the second XOR gate a second XOR output bit by applying a XOR operation on the first XOR output bit and on an output bit of the flip-flop, the output bit of the flip-flop represents a second XOR output bit provided to the flip-flop during a previous clock cycle.

d. Applying (524) by the second AND gate an AND operation an inverted output bit of the flip flop and on the first AND output bit.

e. Applying (525) by the OR gate an OR operation on the first and second AND output bits to provide the certain modified output PDM bit.

Figure 8:
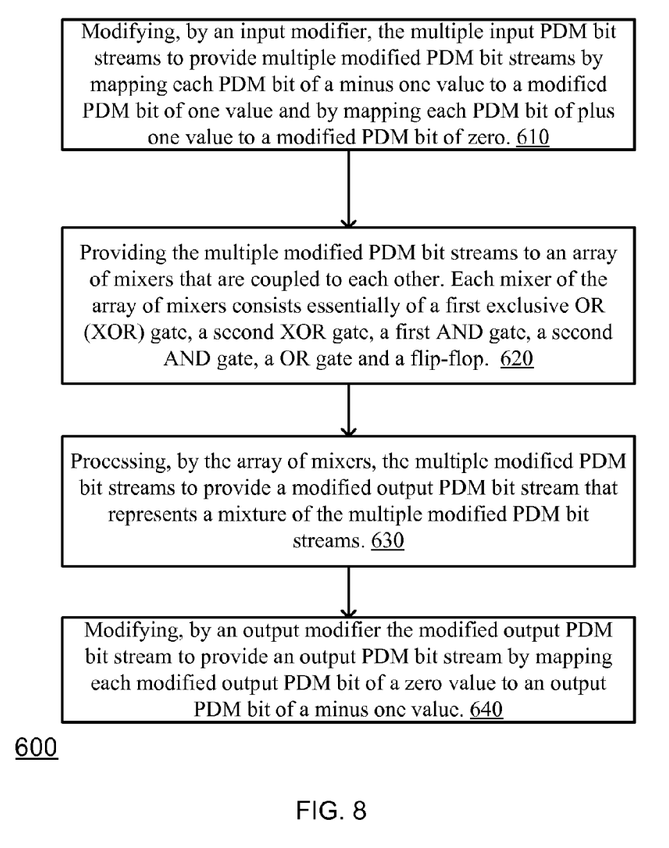
FIG. 8 illustrates a method according to an embodiment of the invention.

FIG. 8 illustrates a method 600 for mixing multiple (N) pulse density modulated (PDM) bit streams.

Method 600 may start by stage 610 of modifying, by an input modifier, the multiple input PDM bit streams to provide multiple modified PDM bit streams by mapping each PDM bit of a minus one value to a modified PDM bit of zero value. Stage 610 may include (or may be preceded by) converting analog signals to PDM bit streams.

Stage 610 may be followed by stage 620 of providing the multiple modified PDM bit streams to an array of mixers that are coupled to each other. The mixers of the array can be mixer 300 of FIG. 4.

Each mixer of the array of mixers consists essentially of a first exclusive OR (XOR) gate, a second XOR gate, a first AND gate, a second AND gate, a OR gate and a flip-flop. A first input of the first XOR gate and a first input of the first AND gate form a first input port of the mixer. A second input of the first XOR gate and a second input of the first AND gate form a second input port of the mixer. An output of the first XOR gate is coupled to a first input of the second XOR gate and to a non-inverting input of the second AND gate. An output of the second XOR gate is coupled to an input port of the flip-flop. An output of the first AND gate is coupled to a first input of the OR gate. An output port of the flip-flop is coupled to a second input of the second XOR gate. An output port of the flip-flop is coupled to an inverting input of the second AND gate and to a second input of the second XOR gate. An output of the second AND gate is coupled to a second input of the OR gate. And an output of the OR gate forms an output port of the mixer.

Stage 620 may be followed by stage 630 of processing, by the array of mixers, the multiple modified PDM bit streams to provide a modified output PDM bit stream that represents a mixture of the multiple modified PDM bit streams.

Stage 630 may be followed by stage 640 of modifying, by an output modifier the modified output PDM bit stream to provide an output PDM bit stream by mapping each modified output PDM bit of a zero value to an output PDM bit of a plus one value, and each modified output PDM bit of a one value to an output PDM bit of a minus one value. Stage 640 may include (or may be followed by) converting the output PDM bit stream to an analog signal.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A device for mixing multiple (N) pulse density modulated (PDM) bit streams of a bit rate, the device comprises an input logic, an error accumulation circuit, a error correction circuit and an adder of more than N bits;
    wherein the device is arranged to output an output PDM bit stream that represents a mixture of the multiple input PDM bit streams; wherein the output PDM bit stream comprises a plurality of output PDM bits, wherein a certain output PDM bit of a plurality of output PDM bits that form the output PDM bit stream is generated during a certain clock cycle;
    wherein the input logic is arranged to select, during each fraction of the certain clock cycle, a current bit of a selected PDM bit stream, wherein different PDM bit streams are selected during different fragments of the certain clock cycle;
    wherein the error accumulation circuit is arranged to store intermediate values during a first fraction till a penultimate fraction of the certain clock signal and to store a last value during a last fraction of the certain clock signal; wherein a sign of the last value is provided as the certain PDM output bit;
    wherein the adder is arranged to add, during each fraction of the certain clock cycle, the current bit of the selected PDM bit stream to on an intermediate value that was calculated during a previous fraction; and
    wherein the error correction circuit is arranged to apply an error correction on the last value to provide an updated value that is provided as an intermediate value during a first fraction of a clock cycle that follows the certain clock cycle.

2. The device according to claim 1 wherein the input logic is further arranged to generate, in response to a sign of the current bit of the selected PDM bit stream, a first control signal; and wherein the adder is arranged to perform, during each fraction of the certain clock cycle, a selected arithmetic operation out of subtraction and addition, wherein the selected arithmetic operation is selected in response to the first control signal.

3. The device according to claim 2 wherein the adder is arranged to apply the selected arithmetic operation on an absolute value of the current bit of the selected PDM bit stream and on an intermediate value that was calculated during a previous fraction.

4. The device according to claim 2 further comprising a coefficient multiplexer that is arranged to select a selected coefficient associated with the selected PDM bit stream;
wherein the adder is arranged to perform the selected arithmetic operation on the selected coefficient and on an intermediate value that was calculated during a previous fraction.

5. The device according to claim 1 wherein the error correction circuit is arranged to generate an updated value by adding to the last value an error correction constant if the last value is negative and by subtracting from the last value the error correction constant if the last value is positive.

6. The device according to claim 1 wherein the device further comprises a digital delay circuit that is arranged to introduce adjustable delay periods to current bits of the multiple input PDM bit streams to provide delayed current bits to the input circuit.

7. The device according to claim 1 wherein the input logic, the error accumulation circuit, the error correction circuit and the adder are embedded in a handset and wherein the multiple input PDM bit streams are provided from multiple microphones.

8. The device according to claim 1 wherein the input logic, the error accumulation circuit, the error correction circuit and the adder are embedded in an interfacing circuit and wherein the multiple input PDM bit streams are provided from multiple microphones.

9. A mixer for mixing first and second modified pulse density modulated (PDM) bit streams to provide an output modified PDM bit stream;
wherein the mixer consists essentially of a first exclusive OR (XOR) gate, a second XOR gate, a first AND gate, a second AND gate, a OR gate and a flip-flop;
wherein a minus one value of a PDM bit is mapped to a one value of a modified PDM bit and a plus one value of a PDM bit is mapped to a zero value of a modified PDM bit;
wherein a first input of the first XOR gate and a first input of the first AND gate are arranged to receive the first modified PDM bit stream;
wherein a second input of the first XOR gate and a second input of the first AND gate are arranged to receive the second modified PDM bit stream;
wherein an output of the first XOR gate is coupled to a first input of the second XOR gate and to a non-inverting input of the second AND gate;
wherein an output of the second XOR gate is coupled to an input port of the flip-flop;
wherein an output of the first AND gate is coupled to a first input of the OR gate;
wherein an output port of the flip-flop is coupled to a second input of the second XOR gate;
wherein an output port of the flip-flop is coupled to an inverting input of the second AND gate and to a second input of the second XOR gate;
wherein an output of the second AND gate is coupled to a second input of the OR gate; and
wherein an output of the OR gate forms an output port of the mixer for providing the output modified PDM bit stream.

10. The mixer according to claim 9 wherein the first XOR gate and the first AND gate are arranged to receive during a certain clock cycle a certain modified bit of the first PDM bit stream and a certain modified bit of the second PDM bit stream;
wherein the first XOR gate is arranged to apply a XOR operation on the certain bits of the first and second PDM bit streams to provide a first XOR output bit;
wherein the first AND gate is arranged to apply an AND operation on the certain modified bits of the first and second PDM bit streams to provide a first AND output bit;
wherein the second XOR gate is arranged to generate a second XOR output bit by applying a XOR operation on the first XOR output bit and on an output bit of the flip-flop, the output bit of the flip-flop represents a second XOR output bit provided to the flip-flop during a previous clock cycle;
wherein the second AND gate is arranged to apply an AND operation an inverted output bit of the flip flop and on the first AND output bit; and
wherein the OR gate is arranged to apply an OR operation on the first and second AND output bits to provide a certain modified output PDM bit.

11. A device for mixing multiple (N) pulse density modulated (PDM) bit streams, the device comprises:
an input modifier arranged to modify the multiple input PDM bit streams to provide multiple modified PDM bit streams by mapping
a minus one value of each PDM bit to a one value of a modified PDM bit and by mapping a plus one PDM bit to a minus one value modified PDM bit;
an array of mixers that are coupled to each other, the array of mixers are arranged to receive the multiple modified PDM bit streams and to output a modified output PDM bit stream that represents a mixture of the multiple modified PDM bit streams;
wherein each mixer of the array of mixers consists essentially of a first exclusive OR (XOR) gate, a second XOR gate, a first AND gate, a second AND gate, a OR gate and a flip-flop;
wherein a first input of the first XOR gate and a first input of the first AND gate form a first input port of the mixer;
wherein a second input of the first XOR gate and a second input of the first AND gate form a second input port of the mixer;
wherein an output of the first XOR gate is coupled to a first input of the second XOR gate and to a non-inverting input of the second AND gate;
wherein an output of the second XOR gate is coupled to an input port of the flip-flop;
wherein an output of the first AND gate is coupled to a first input of the OR gate;
wherein an output port of the flip-flop is coupled to a second input of the second XOR gate;

wherein an output port of the flip-flop is coupled to an inverting input of the second AND gate and to a second input of the second XOR gate;

wherein an output of the second AND gate is coupled to a second input of the OR gate; and wherein an output of the OR gate forms an output port of the mixer.

12. The device according to claim 11 further comprising an output modifier arranged to modify the modified output PDM bit stream to provide an output PDM bit stream by mapping each modified output PDM bit of a zero value to an output PDM bit of a minus one value.

13. The device according to claim 11 wherein the array of mixers comprises a binary tree of adders.

14. The device according to claim 11 further comprises a multiplier for multiplying at least one of the output PDM bit stream and the modified output PDM bit stream by a coefficient.

15. A method for mixing multiple (N) pulse density modulated (PDM) bit streams of a bit rate, the method comprises:

receiving the multiple input PDM bit streams; and processing the multiple input PDM bit streams to generate an output PDM bit stream that represents a mixture of the multiple input PDM bit streams; wherein the output PDM bit stream comprises a plurality of output PDM bits;

wherein the processing comprises generating a certain output PDM bit during a certain clock cycle;

wherein the generating of the certain output PDM bit comprises:

selecting, by input logic, during each fraction of the certain clock cycle, a current bit of a selected PDM bit stream, wherein different PDM bit streams are selected during different fragments of the certain clock cycle;

storing intermediate values during a first fraction till a penultimate fraction of the certain clock signal and to store a last value during a last fraction of the certain clock signal; wherein a sign of the last value is provided as the certain PDM output bit;

adding, by an adder and during each fraction of the certain clock cycle, the current bit of the selected PDM bit stream to on an intermediate value that was calculated during a previous fraction; and applying, by an error correction circuit, an error correction on the last value to provide an updated value that is provided as an intermediate value during a first fraction of a clock cycle that follows the certain clock cycle.

16. The method according to claim 15 further comprising generating, in response to a sign of the current bit of the selected PDM bit stream, a first control signal; and performing by the adder and during each fraction of the certain clock cycle, a selected arithmetic operation out of subtraction and addition, wherein the selected arithmetic operation is selected in response to the first control signal.

17. The method according to claim 16 further comprising applying by the added the selected arithmetic operation on an absolute value of the current bit of the selected PDM bit stream and on an intermediate value that was calculated during a previous fraction.

18. The method according to claim 16 further comprising selecting a selected coefficient associated with the selected PDM bit stream and performing the selected arithmetic operation on the selected coefficient and on an intermediate value that was calculated during a previous fraction.

19. The method according to claim 15 comprising generating an updated value by adding to the last value an error correction constant if the last value is negative and by subtracting from the last value the error correction constant if the last value is positive.

20. The method according to claim 15 comprising introducing adjustable delay periods to current bits of the multiple input PDM bit streams to provide delayed current bits to the input circuit.

21. The method according to claim 15 comprising receiving the multiple input PDM bit streams from multiple microphones.

22. A method for mixing first and second modified pulse density modulated (PDM) bit streams to provide an output modified PDM bit stream;

the method comprises receiving the first and second modified PDM bit streams by a mixer; and processing the first and second modified PDM bit streams by the mixer to provide a modified output PDM bit stream;

wherein the mixer consists essentially of a first exclusive OR (XOR) gate, a second XOR gate, a first AND gate, a second AND gate, a OR gate and a flip-flop;

wherein a minus one value of a PDM bit is mapped to a one value of a modified PDM bit and a plus one value of a PDM bit is mapped to a zero value of a modified PDM bit;

wherein a first input of the first XOR gate and a first input of the first AND gate are arranged to receive the first modified PDM bit stream;

wherein a second input of the first XOR gate and a second input of the first AND gate are arranged to receive the second modified PDM bit stream;

wherein an output of the first XOR gate is coupled to a first input of the second XOR gate and to a non-inverting input of the second AND gate;

wherein an output of the second XOR gate is coupled to an input port of the flip-flop;

wherein an output of the first AND gate is coupled to a first input of the OR gate;

wherein an output port of the flip-flop is coupled to a second input of the second XOR gate;

wherein an output port of the flip-flop is coupled to an inverting input of the second AND gate and to a second input of the second XOR gate;

wherein an output of the second AND gate is coupled to a second input of the OR gate; and wherein an output of the OR gate forms an output port of the mixer for providing the output modified PDM bit stream.

* * * * *